United States Patent [19]

Fossheim et al.

[11] Patent Number: 5,627,140
[45] Date of Patent: May 6, 1997

[54] ENHANCED FLUX PINNING IN SUPERCONDUCTORS BY EMBEDDING CARBON NANOTUBES WITH BSCCO MATERIALS

[75] Inventors: Kristian Fossheim, Trondheim, Norway; Thomas W. Ebbesen, Plainsboro, N.J.

[73] Assignees: NEC Research Institute, Inc., Princeton, N.J.; Florida State University, Tallahassee, Fla.

[21] Appl. No.: 445,366

[22] Filed: May 19, 1995

[51] Int. Cl.$^6$ .............................. H01B 1/08; H01B 1/18; C04B 35/45; H01L 39/12

[52] U.S. Cl. .................... 505/401; 505/785; 505/121; 505/320; 505/490; 505/432; 505/491; 505/460; 505/492; 505/782; 257/746; 252/509; 428/930

[58] Field of Search .......................... 505/121, 401, 505/490, 491, 492, 320, 432, 460, 782, 785; 257/746; 156/47; 252/509; 428/930

[56] References Cited

U.S. PATENT DOCUMENTS

| | | | |
|---|---|---|---|
| 5,294,600 | 3/1994 | Tanigaki et al. | 505/100 |
| 5,456,986 | 10/1995 | Majetich et al. | 428/403 |
| 5,457,343 | 10/1995 | Ajayan et al. | 257/746 X |
| 5,489,477 | 2/1996 | Ohta et al. | 428/408 |

OTHER PUBLICATIONS

Fossheim, K., "Enhanced flux pinning in Bi2Sr2CaCu2O8+x superconductor with embedded carbon nanotubes", Physica C, 248, 195–202 Jun. 1995.

Miyamoto, Y., et al., "Ionic Cohesion and Electron Doping of Thin Carbon Tubules with Alkali Atoms", Physical Review Letters, 74(15), 2993–2996 Apr. 1995.

Ajiki, H., "Magnetic Properties of Carbon Nanotubes", Journal of the Physical Society of Japan, 62(7), 2470–2480 Jul. 1993.

Yoshida, Y., "Superconducting single crystals of TaC encapsulated in carbon nanotubes", Applied Physical Letters, 64(22), 3048–3050 May 1994.

Yoshida, Y., "Synthesis of CeC2 Crystals encapsulated within gigantic fullerenes", Applied Physical Letters, 62(26), 3447–3448 Jun. 1993.

Thomas W. Ebbesen, "Carbon Nanotubes," Annu. Rev. Mater. Sci., vol. 24, 1994, pp. 235–264.

T.W. Ebbesen & P.M. Ajayan, "Large-scale synthesis of carbon nanotubes," Nature, vol. 358, 16 Jul. 1992, pp. 220–222.

E. Dujardin et al, "Capillarity and Wetting of Carbon Nanotubes," Science, vol. 265,23 Sep. 1994, pp. 1850–1852.

P.M. Ajayan et al, "Opening carbon nanotubes with oxygen and implications for filling," Nature, vol. 362, 8 Apr. 1993, pp. 522–525.

Paul Calvert, "Strength in disunity," Nature, vol. 357,4 Jun. 1992, pp. 365–366.

J.R. Thompson et al, "Enhanced current density $J_c$ and extended irreversibility in single–crystal $Bi_2Sr_2Ca_1Cu_2O_8$ via linear defects from heavy ion irradiation," Appl. Phys. Lett., vol. 60, 4 May 1992, pp. 2306–2308.

L. Civale et al, "Vortex Confinement by Columnar Defects in $YBa_2Cu_3O_7$ Crystals: Enhanced Pinning at High Fields and Temperatures," Phys. Rev. Lett., vol. 67, 29 Jul. 91, pp. 648–651.

J. Schwartz et al, "Large critical current density in neutron–irradiated polycrystalline $HgBa_2CuO_{4+\delta}$" Phys. Rev. B, vol. 48, 1 Oct. 93, pp. 9932–9934.

J. Schwartz and Shiming Wu, "Enhanced flux–line pinning in $Bi_2Sr_2CaCu_2O_x$ by neutron irradiation and Li(n, $^3$T)$\alpha$ reaction–induced charged–particle defects," J. Appl. Phys., vol. 73, 1 Feb. 93, pp. 1343–1347.

C.J. van der Beek et al, "Vortex Line Pinning and Bose–Glass Dynamics in Heavy–Ion Irradiated $Bi_2Sr_2CaCu_2O_{8+\delta}$ Single Crystals," Phys. Rev. Lett., vol. 74, 13 Feb. 1995, pp. 1214–1217.

W. Zhang and E.E. Hellstrom, "The influence of carbon on melt processing Ag sheathed $Bi_2Sr_2CaCu_2O_8$ tape," Physica C, vol. 234, 1994, pp. 137–145.

M. Murakami, "Melt Processing of YBaCuO Superconductors and Critical Currents," Mod. Phys. Lett. B, vol. 4, 1990, pp. 163–179.

*Primary Examiner*—Douglas J. McGinty
*Attorney, Agent, or Firm*—Philip J. Feig

[57] ABSTRACT

Enhanced flux pinning in superconductors is achieved by embedding carbon nanotubes into a superconducting matrix. The carbon nanotubes simulate the structure, size and shape of heavy ion induced columnar defects in a superconductor such as $Bi_2Sr_2CaCu_2O_{8+x}$. The nanotubes survive at treatment temperatures of up to approximately 800° C. both in oxygen containing and in inert atmospheres. The superconducting matrix with nanotubes is heat treated at a lower temperature than the temperature used to treat the best case pure superconductor material.

37 Claims, 7 Drawing Sheets

ENHANCED FLUX PINNING IN SUPERCONDUCTORS BY EMBEDDING CARBON NANOTUBES WITH BSCCO MATERIALS

FIELD OF THE INVENTION

The present invention relates to high-temperature superconductors and specifically to enhanced flux pinning in superconductors by embedding nanotubes in a superconductor and preferably by embedding carbon nanotubes in $Bi_2Sr_2CaCu_2O_{8+x}$ (Bi2212) superconductors.

BACKGROUND OF THE INVENTION

The pinning of magnetic flux lines in anisotropic high-temperature superconductors is an area of active research. In Bi-based materials, weak flux-line pinning above intermediate temperatures (T>20K) severely constrains potential magnet applications and restricts liquid-nitrogen temperature applications to a very low magnetic field (<1T). In order to overcome these limitations, it is desirable to discover flux-pinning methodologies for introducing effective pinning centers in materials potentially useful for commercial applications, such as, but not limited to, thin films, thick films, wires and/or tapes.

Increased transport critical currents in high-temperature superconductors is a primary goal of high-temperature superconductor physics and engineering. The ability to increase the current greatly raises the potential use of high Tc superconductors in a wide range of applications.

Progress in this regard has been reported concerning very high magnetic moments in superconducting single crystals and polycrystals such as $YBa_2Cu_3O_7$(Y123) with Y211 precipitates of approximately 0.1 µm diameter. Amorphous tracks of approximately 10 µm diameter and 1 to 10 µm length created by the use of heavy ion bombardment has been shown to substantially increase flux line pinning in Y123 and $Bi_2Sr_2CaCu_2O_{8+x}$ (Bi2212) superconductors. Proton irradiation with a subsequent decay of Bi nuclei created amorphous tracks in BiSrCaCuO (BSCCO family) similar to the heavy ion tracks, but of shorter length. Neutron irradiation of $HgBa_2CaCu_2O_{6+x}$ has been shown to increase the magnetization hysteresis as well as to considerably lift the irreversibility line. Li doping has been shown to enhance collective pinning.

Each of the above techniques, except for Li doping, has practical difficulties when contemplating commercial applications. For example, it would be extremely difficult to transfer the method of making high magnetic moment superconductor for use with arbitrary shapes or wires. The use of heavy ion bombardment in large scale applications is virtually unimaginable. The unavailability of accelerator energies for proton irradiation for large scale application is a limiting factor as well as the problem of radioactivity in the silver sheath of the tapes. Similarly, neutron irradiation has practical problems for commercial application.

Therefore, most promising work appears to be in the field of embedding defects or dopants into a superconductor matrix, preferably by premixing the components, followed by a reaction process or alternatively, precipitating nanoparticles during processing as was achieved in Y123 crystals with Y211 precipitates.

The preferred method, in most cases, is to premix nanoparticles or atomic constituents into a precursor powder followed by standard processing procedures or variations thereon, for example, calcination, melting and oxygenation.

The achievement of better pinning in high-temperature superconductors in the described manner will result in several advantages, including industrial scale-up and shape problems being obviated, the anisotropy of magnetic properties being substantially diminished and critical currents being achieved for a wider range of applications, provided that the additives do not result in a deterioration of the contact between grains.

The type of particles needed for achieving these results would be of a shape and a dimension similar to the columnar tracks obtained from heavy ion irradiation. Moreover, the particles have to be stable in the very aggressive chemical environment at the elevated temperature required to optimize superconductivity in the matrix material. The content and composition of the particles, once embedded in the matrix, might not be critical (barring strong ferromagnetism).

The primary object of the method is to displace superconducting matrix material from a volume suitable for achieving strong pinning over some length of the magnetic vortices penetrating the material. The comparison with columnar defects created by ion tracks is that ion tracks are an ill-defined amorphous substance, in all probability not superconductive at all.

In an article by P. Calvert entitled "Strength in disunity," in Nature, vol. 356, Jun. 4, 1992, page 365, the use of polymer composites with tubular fullerenes having diameters of a few nanometers and a length of up to several micrometers, i.e. carbon nanotubes, for increased structure strength is described.

The present invention provides enhanced flux pinning in superconductors by embedding carbon nanotubes in the superconducting matrix.

In order to accomplish the desired results, particularly with regard to size and shapes, carbon nanotubes are embedded in the superconductor in an effort to match the required electrical requirements with the need to survive the hostile environment to which the nanotubes would be exposed or that the volume displaced by the nanotubes remains a non-superconducting region (as a void or blended defect) even if the nanotubes themselves are fully or partially consumed. The major problems to be overcome are wettability of the nanotubes, a lack of stability of the nanotubes and/or displaced volumes (i.e. collapsing of any voids or disappearance of extended defects created by the fully or partially consumed nanotubes) at elevated temperatures, and the detrimental influence the reaction between carbon and oxygen could have in view of literature evidencing such an effect.

The use of carbon nanotubes meets the requirements of shape, size, availability and scale-up potential. In addition, in highly anisotropic materials of the Bi-family the flux lines are pinned by columnar defects over a wide range for the relative orientation of the defects and the magnetic field. Therefore, by embedding particles having the shape of nanotubes and oriented at random, the magnetic anisotropies would be expected to be greatly reduced. The possibility of large scale production of nanotube material is described in an article by T. W. Ebbesen et al entitled "Large-scale Synthesis of Carbon Nanotubes" in Nature, vol. 358, Jul. 16, 1992, pages 220 to 222.

Thus, the embedding of carbon nanotubes in superconducting material, and particularly in the BSCCO family of superconducting material, and specifically in $Bi_2Sr_2CaCu_2O_{s+x}$ superconducting material, results in superconducting material exhibiting enhanced flux pinning.

Other BSCCO family members include $(Bi, Pb)_2Sr_2Ca_2Cu_{10+x}$.

SUMMARY OF THE INVENTION

There are two major issues to be considered regarding the use of nanotubes in superconductors. First, the superconductor must wet the nanotube. Second, the the reaction between the nanotubes and oxygen at elevated temperatures, e.g. temperatures above approximately 700° C., must be minimized.

In order to achieve the enhanced flux pinning, the nanotubes must make wetting contact with the superconducting matrix. Nanotubes are known to be selective in this regard in relation to many materials. See, for example, an article by E. Dujardin et al entitled "Capillarity and Wetting of Carbon Nanotubes," in *Science*, vol. 265, Sep. 23, 1994, pages 185- to 1852. The wetting allows a desirable interaction between the superconducting matrix and the nanotubes, protection against excessive reaction between the nanotubes and oxygen and the formation of displaced volumes (voids or extended defects) in the material which assume the shape of the nanotubes and will survive even if the nanotube is consumed. The creating of columnar structures by the opening of the tips of nanotubes in a matrix due to oxidation followed by capillary filling of the interior of the nanotube is described in an article by P.M. Ajayan et al entitled "Opening carbon nanotubes with oxygen and implications for filling," in *Nature*, vol. 362, Apr. 8, 1993, pages 522 to 525.

The reaction between carbon and oxygen generates carbon dioxide which escapes primarily to the surroundings but also partially escapes into the superconducting matrix. It has been reported by Zhang et al in an article entitled "The influence of carbon on melt processing Ag sheathed $Bi_2Sr_2CaCu_2O_s$ tape," in *Physica C*, vol. 234, pages 137 to 145 (1994) that carbon has a negative influence on superconducting properties. A more serious problem is that the nanotubes are burned away. The speed of the reaction increases exponentially with temperatures above approximately 700° C. If, however, the nanotubes are embedded within the grains of the superconductivity matrix before the material is exposed to oxygen, the nanotubes can survive the subsequent heating, even if some reaction with the oxygen from the superconductor material still results in the production of carbon dioxide but at a much reduced rate within the grains of the superconductor matrix. Embedding of nanotubes within the grains is possible only if wetting occurs.

In accordance with the teachings of the present invention, carbon nanotubes are embedded into the superconducting matrix of a high-Tc superconductor. The nanotubes are embedding by wetting action for allowing atomic scale contact between the nanotubes and superconductor in order to simulate the conditions obtained by columnar defects created by heavy ion tracks.

The embedded nanotubes are protected such that they survive under conditions and at temperatures where such survival have not previously been achieved. The nanotubes are embedded at a temperature lower than the temperature at which the pure superconductor is treated for exhibiting its best superconductivity characteristics. Moreover, the nanotube embedded material exhibits better superconducting properties than the pure superconductor.

The nanotubes are embedded in the superconductor such that they become sites for strong, columnar defect like pinning.

The preferred superconducting material is a BSCCO family superconducting material and particularly $Bi_2Sr_2CaCu_2O_{8+x}$. The nanotubes survived treatment at temperatures up to approximately 800° C., well above temperatures previously achieved. The wetting action of the nanotubes was observed after treatment both in oxygen and in argon atmospheres. The displaced volume, void or other defects created by a nanotube that is subsequently consumed, also survives because the melting temperature of the material is higher (approximately 890° C.) than the treatment temperature in air (approximately 806° C.).

A principal object of the present invention is therefore, the provision of a method of embedding carbon nanotubes in superconducting material.

Another object of the present invention is the provision of a method of embedding carbon nanotubes into $Bi_2Sr_2CaCu_2O_{8+x}$ superconductor.

A further object of the present invention is the provision of a superconductor with embedded carbon nanotube for enhanced flux pinning.

A still further object of the invention is the provision of a $Bi_2Sr_2CaCu_2O_{8+x}$ superconductor with embedded carbon nanotube for enhanced flux pinning.

A still another object of the invention is the provision of a superconductor with voids or other defects formed from carbon nanotubes that are subsequently consumed.

A yet another object of the invention is the provision of a $Bi_{28}Sr_2CaCu_2O_{s+x}$ superconductor with voids or other extended defects formed from carbon nanotubes that are subsequently consumed.

Further and still other objects of the present invention will become more clearly apparent when the following description is read in conjunction with the accompanying drawing.

DETAILED DESCRIPTION OF THE INVENTION

Figure 1:
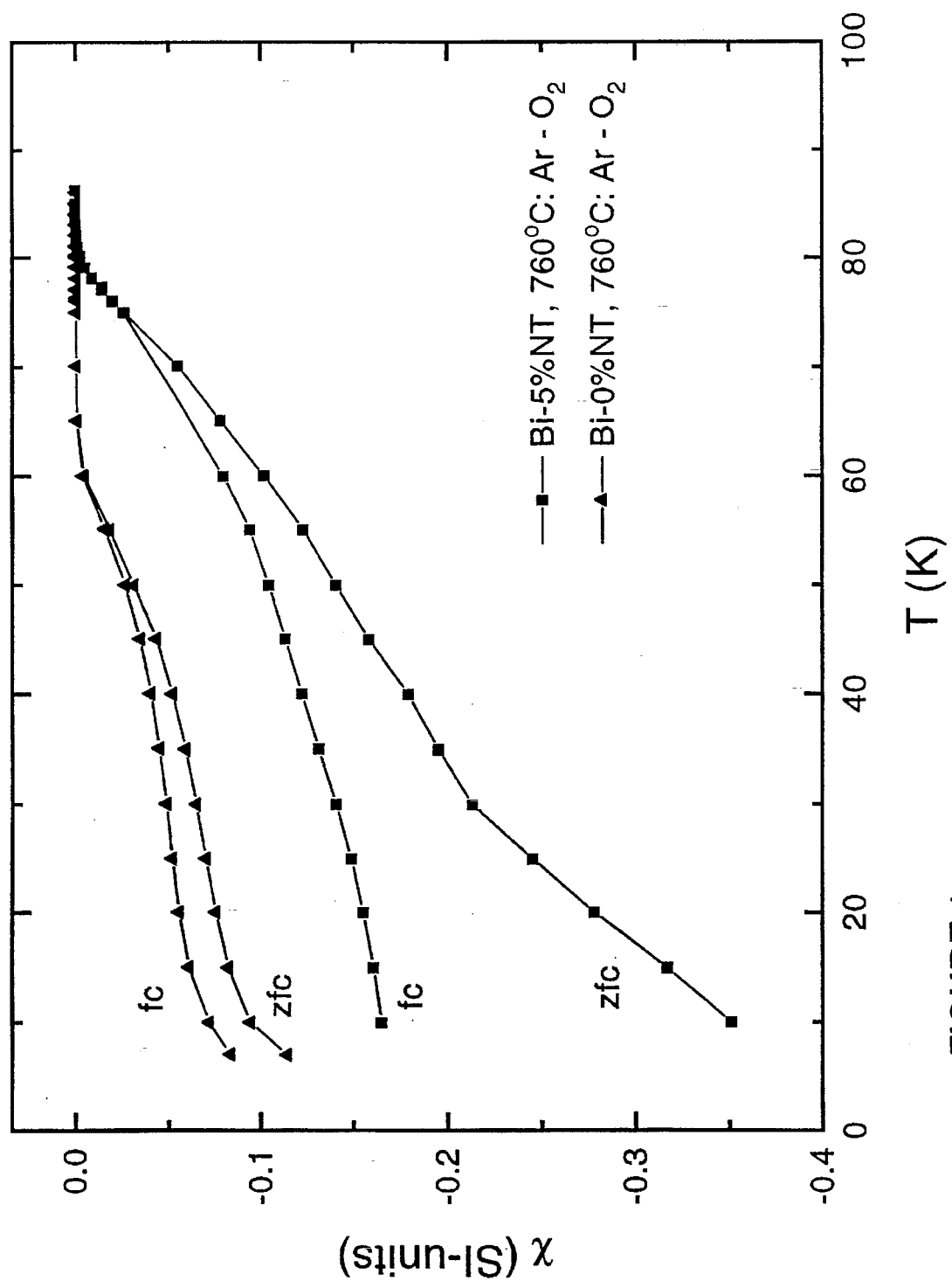
FIG. 1 is a graph of DC susceptibility of Bi-0%NT and Bi-5%NT as a function of temperature.

In order to demonstrate the enhanced pinning achieved by mixing carbon nanotubes into superconductor matrix an experiment was conducted using superconductivity powder comprising intermediate precursor $Bi_2Sr_2CaCu_2O_{8+x}$ made by SSC, Inc. from 99.9% purity raw materials, calcinated at 850° C. for 6 hours. The particle size was specified as fine agglomerate, ball milled. The carbon nanotube powder was prepared in accordance with the teachings in Ebbesen et al, supra, using a carbon arc. The raw sample was taken from the deposit in the carbon arc and then ground with a mortar and pestle.

Initially the powders were hand mixed. However, a preferred mixing method comprises dispersing the powders in a non-reactive solvent, such as ethanol, and ultrasound sonicating the mixture at high intensity. Subsequently, the ethanol is carefully evaporated by applying vacuum at room temperature. The resultant mixture was formed into pellets by compressing the powders under 1 kbar uniaxial pressure.

In an attempt to circumvent the difficulties of wetting and oxygen reaction, a pre-calcination protocol is followed by first heating the powder mixture in an atmosphere having an absence of an oxidizing agent, such as argon. The result is a lowering of the melting temperature of the Bi2212-nanotube (Bi-NT) mixture from approximately 890° C. to approximately 806° C. The pre-treatment in an atmosphere having an absence of an oxidizing agent allows for good wetting contact between the nanotubes and the superconducting matrix. The sample is subsequently treated in an oxygen containing atmosphere in order to restore the superconducting phase of the sample. Some samples were prepared by initially treating the powder mixture in a flowing argon atmosphere at a temperature below the melting temperature, i.e. at approximately 760° C. A reference pellet of pure Bi2212 was made concurrently with the Bi-NT, under the same conditions as those of the Bi-NT.

The effect of the initial treatment in an argon atmosphere is the removal of much of the oxygen from the material. The next step is oxygen restoration in the superconducting matrix. Tests were performed at different temperatures, with different samples. Data was taken at 30 degree intervals in the range from approximately 760° C. to 890° C. (see FIG. 3). Bi-NT samples made in this manner were checked for nanotube content by TEM. In some cases SEM was used for overall characterization of the grain structure.

Measurements were made on the samples in order to determine the superconductivity characteristics of the same. The measurements including field cooled (fc) and zero-field cooled (zfc) susceptibility measurements were used to determine the superconducting temperature Tc and to approximate the superconducting fraction. The magnetization hysteresis loops were measured at several temperatures, typically at 10° K., 30° K., 50° K. and 65° K. in magnetic fields up 5.5 tesla. At the lower temperatures the field was too low to determine the irreversibility line, but at higher temperatures, i.e. at about 40° K. and above, the irreversibility field corresponding to the closing of the magnetization loop could be found for each temperature. Structural studies using TEM to search for embedded nanotubes and SEM were used to view the overall sample topology and confirmed the presence of nanotubes.

Another important factor is the nanotube concentration in the mixture. Initially, a calculation was made of how many nanotubes of 10 nm diameter and 1 μm length would be needed to make a sample with a matching field of 1T in a 1 cm$^3$ volume, assuming that all the nanotubes would be effective in flux pinning. The calculation resulted in approximately $5\times10^{14}$ nanotubes being required per cm$^3$. The resulting volume the nanotubes would occupy is approximately 40 mm$^3$ i.e. 4% vol. Since the density of carbon nanotubes is much lower than the density of Bi2212, this would correspond to less than 1% wt when mixed together. In anticipation of significant burn out of nanotubes during heat treatment, particularly in oxygen and in the atmosphere, the standard nanotube weight percentage was increased to 5 percent to compensate for the loss. During tests, the percentages were varied from 0 to 14 percent by weight. Alternatively, the quantity of nanotubes required can be estimated from the knowledge that 1 mg of carbon nanotube powder contains on the order of $10^{13}$ to $10^{14}$ nanotubes. In the following description, the notation Bi-x%NT will be used to refer to materials made from starting concentration of x% nanotubes by weight.

Having described the sample preparation and test procedures used, and referring now to the figures and to FIG. 1 in particular, graphs are shown of the susceptibility of pure Bi2212 and Bi-5%NT as a function of temperature. The heat treatment protocol of the samples in FIG. 1 was to heat the samples in an atmosphere having an absence of an oxidizing agent, such as argon, at a temperature of up to 760° C. followed by treatment in an oxygen containing atmosphere, e.g. oxygen, for 39 hours.

Superconductivity of the pure material treated at 760° C. in argon followed by treatment in air at 760° C. is known. FIG. 1 shows an unexpected result that the Tc was increased in the sample containing a mixture of Bi2212 and nanotubes. Moreover, the superconductivity fraction is much higher in the sample containing nanotubes than in the pure Bi2212 sample.

Figure 2:
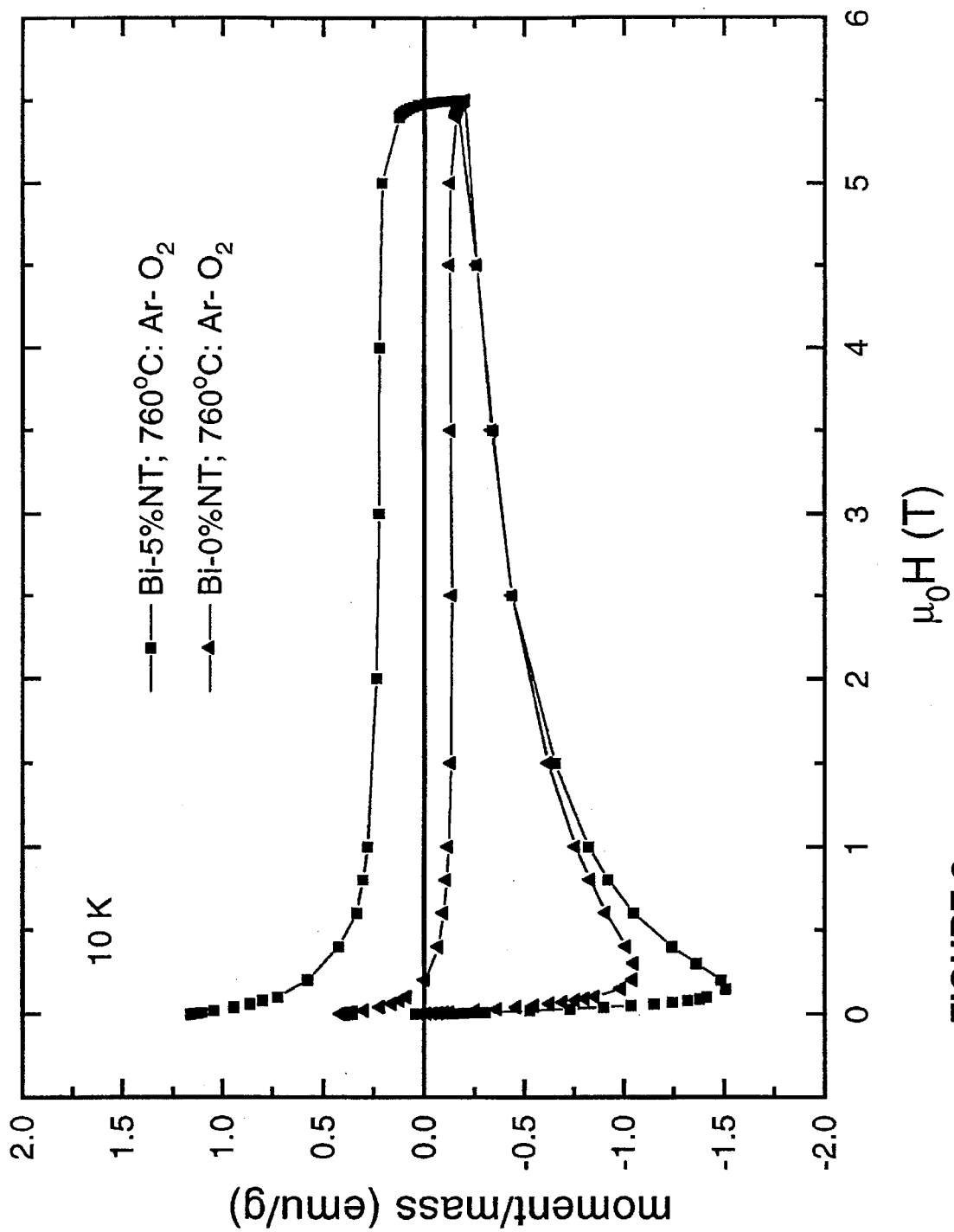
FIG. 2 is a graph of the magnetization hysteresis loop of magnetic moment per gram mass as a function of magnetic field of the samples.

FIG. 2 is a graph of the magnetization hysteresis loop of magnetic moment per gram mass (emu/g) or the magnetic moment in SI units of $A^2/kg$ as a function of magnetic field for the same sample as used in FIG. 1. The hysteresis loop for the sample containing nanotubes is wider than that of the pure Bi2212 sample made under the same conditions. Moreover, the return side of the hysteresis loop is on the positive side of the magnetization in the Bi-NT sample, while the return side remains negative for almost the entire hysteresis loop for the pure Bi2212 sample. These two characteristics provide evidence that the nanotubes have the effect of strong pins, with pinning properties similar to those encountered with columnar defects.

Since the presence of nanotubes is found inside grains as well as sticking to the material surface and sticking out of the grains and nanotubes are observed both prior to and after oxygen treatment, desired wetting of the nanotubes has occurred.

Figure 3:
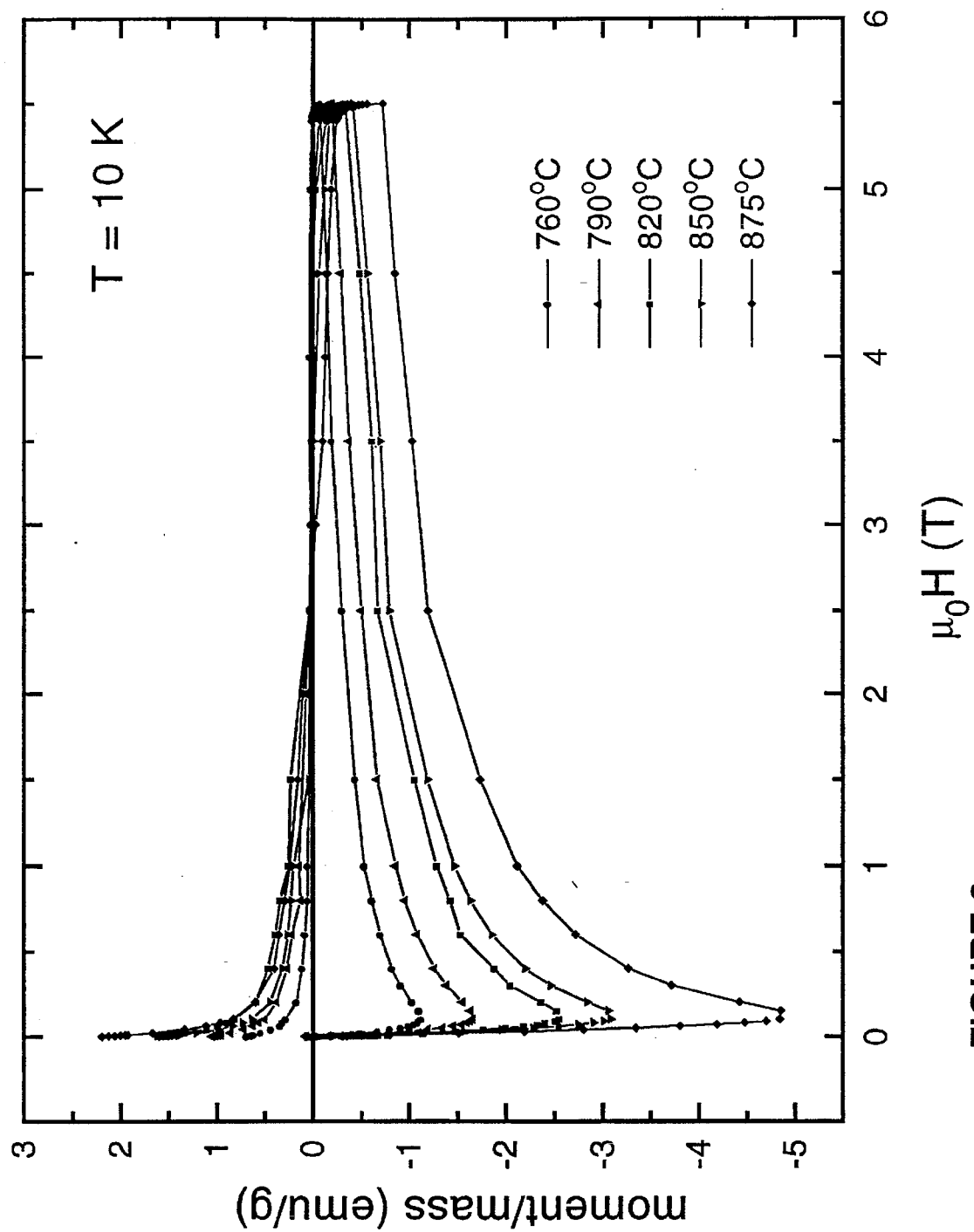
FIG. 3 is a graph of magnetic hysteresis at several temperatures of oxygen treatment, measured at 10° K.

FIG. 3 shows the results of the magnetic hysteresis measurements of the Bi-5%NT sample as a function of the final temperature of the oxygen treatment. At the higher treatment temperatures, the hysteresis loop became wider.

In order to determine whether, in fact, nanotube pinning occurs on a macroscopic scale, the following criteria are used: (1) the best case magnetic hysteresis with Bi-NT is better (i.e. wider and with a positive return magnetization) than the best case magnetization hysteresis with pure Bi2212, (2) the irreversibility line in the material containing nanotubes is shifted to higher fields and temperatures than in the best pure Bi2212 case, at least in part of the B,T plane, and (3) nanotubes embedded in the superconducting matrix are present. Empirical data indicated that the optimum for pure Bi2212 had the best hysteresis loop when treated in air at 890° C. This became the standard against which all Bi-NT samples were tested.

However, the nanotubes burned out at 890° C. treatment as shown by the results for Bi-NT and Bi2212 merging and there being only little difference in the magnetization hysteresis loop. Moreover, nanotubes were not seen with TEM. Thereafter, it was discovered that treatment in an argon atmosphere at approximately 806° C. resulted in better quality superconducting matrix than that obtained when treating at 760° C. At the same time, access to oxygen would be restricted by embedding so that the nanotubes could tolerate the relatively high temperature used for the ensuing oxygen treatment.

Figure 4:
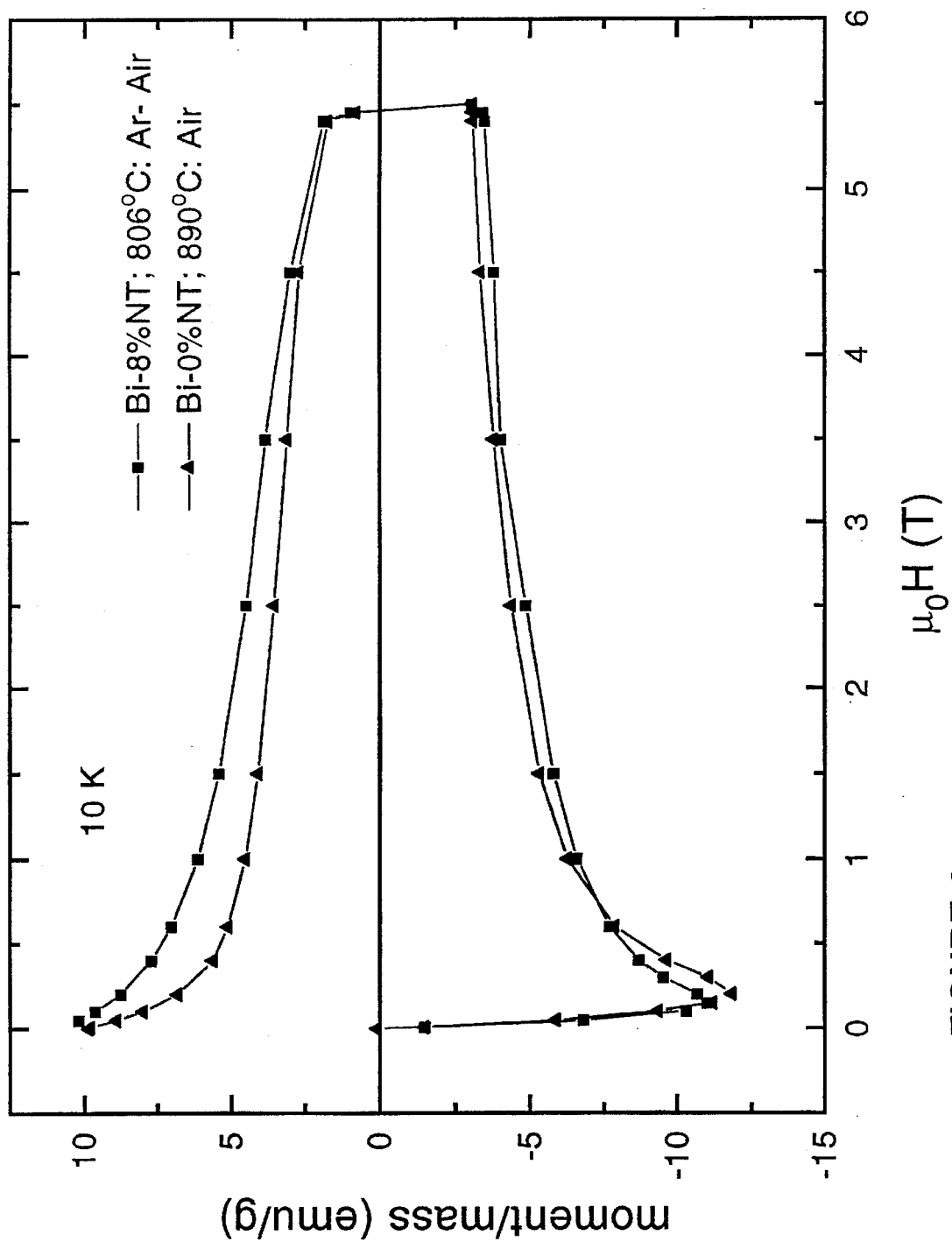
FIG. 4 is a graph of the magnetic hysteresis loops measured at 10° K. for Bi-0%NT treated in air at 890° C. and for Bi-8%NT treated at 806° C. in argon followed by treatment in air.
Figure 5:
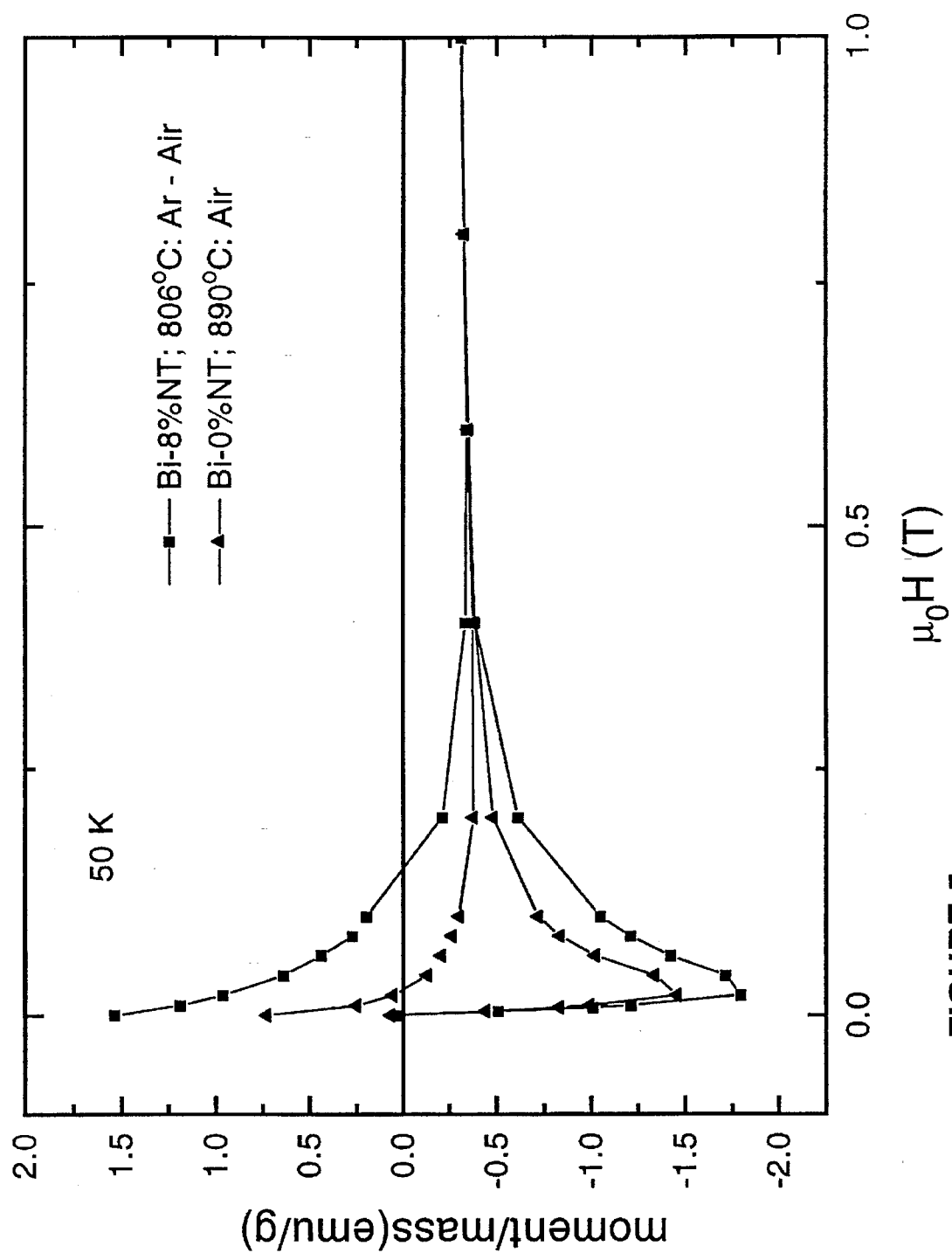
FIG. 5 is a graph of the magnetic hysteresis loops of the samples used for FIG. 4 measured at 50° K.
Figure 6:
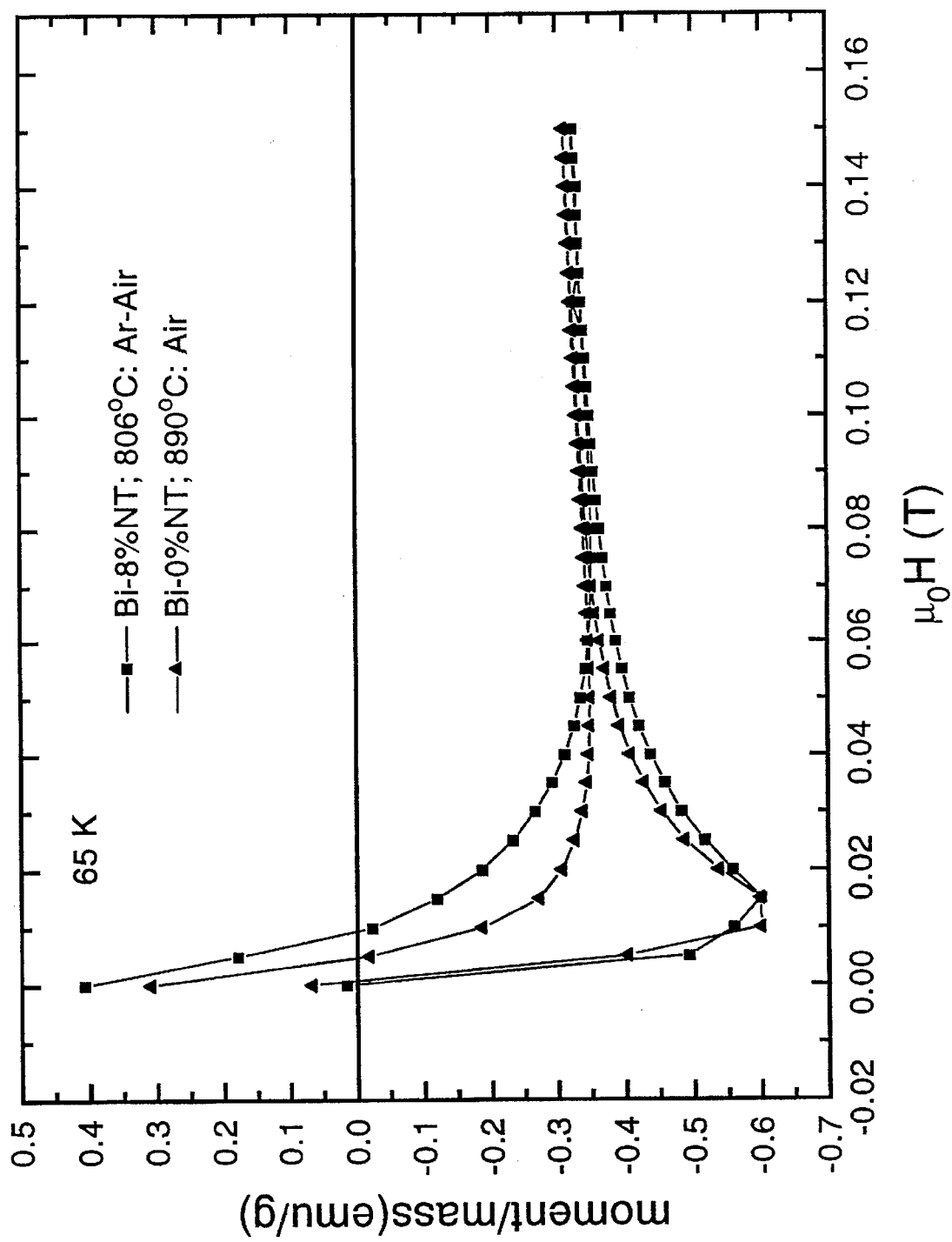
FIG. 6 is a graph of the magnetic hysteresis loops of the samples used for FIG. 4 measured at 65° K.
Figure 7:
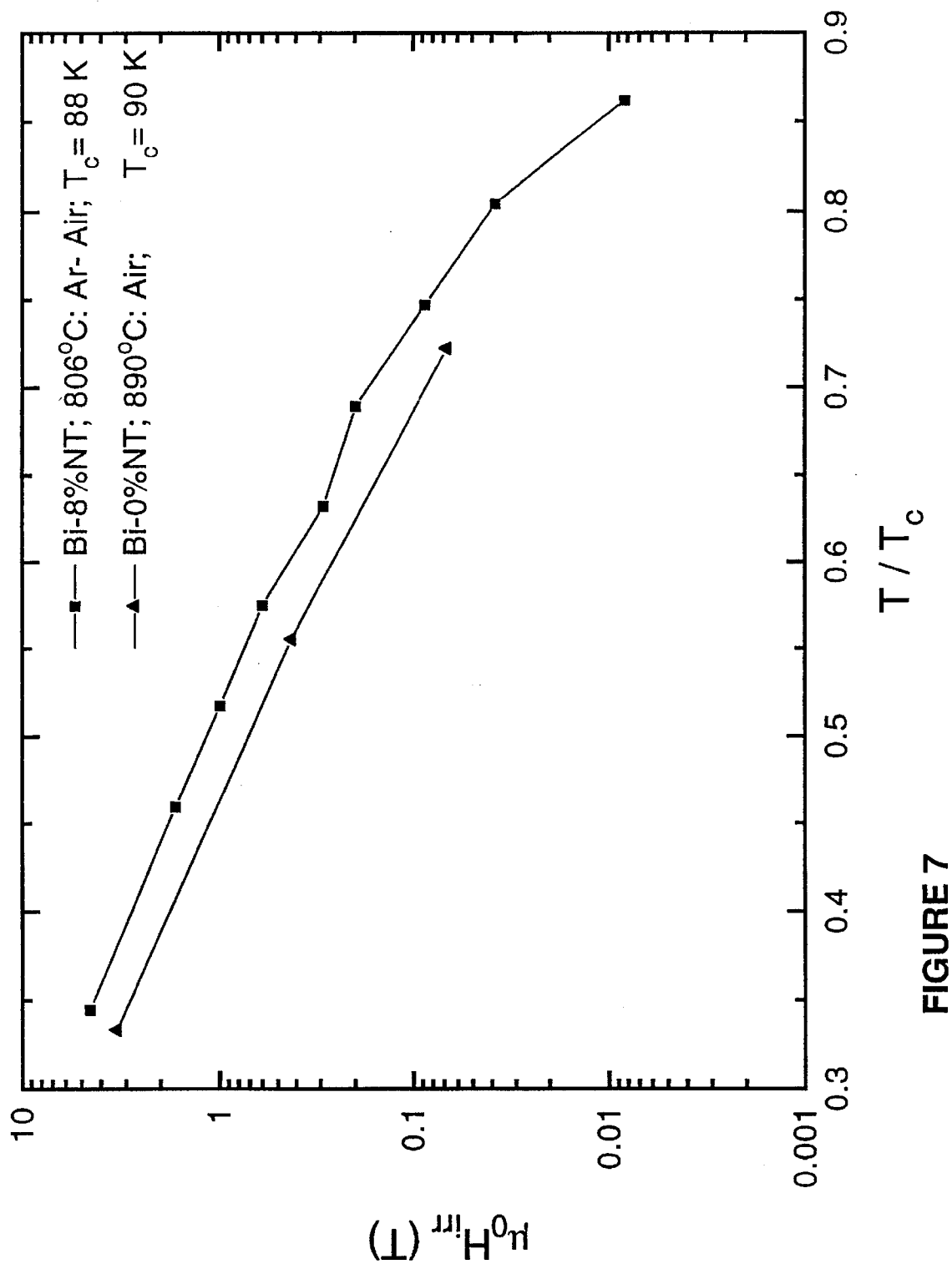
FIG. 7 is a graph of irreversibility lines measured with the samples used for FIG. 4.

A temperature of 806° C. was found to provide the best results. FIGS. 4, 5 and 6 show the magnetization hysteresis loops in Bi-8%NT and pure Bi2212. The nanotube embedded samples show more favorable curves, as best seen at 50° K. in FIG. 5. FIG. 7 shows the irreversibility lines for the same two samples. TEM studies showed the presence of nanotube structures in the superconducting material. SEM studies showed that the grain size is smaller in Bi-8%NT than in the pure material reference. This result indicates that the pinning is increased by approximately an order of magnitude as compared to the best case of pure superconducting material. These properties can most likely be further improved by systematic optimization.

It will be apparent to those skilled in the art that during treatment of the material containing embedded nanotubes, that some of the nanotubes may be consumed thereby creating a columnar volume free from superconductivity in the superconducting material. For example, by first treating the material at 806° C. in an argon atmosphere, the melting point of the material will be less than the melting of the pure superconducting material. Subsequent treatment of the material, at the same 806° C., in an oxygen containing atmosphere results in the nanotube tips being consumed. It is believed that superconducting matrix can enter the nanotube by capillary action or the nanotube will be consumed but since the temperature is below the melting point (approximately 890° C.) of the superconducting matrix material, a void will be formed in the superconducting material. In either case, a superconducting sample is formed exhibiting enhanced flux pinning. It is also possible that remnants of nanotubes may remain. These would also perform the function of flux pinning.

While there has been described and illustrated a preferred superconducting material embedded with carbon nanotube for achieving enhanced flux pinning and a preferred method of fabricating such a superconductor it will be apparent to those skilled in the art that variations and modifications are possible without deviating from the broad teachings and spirit of the present invention which shall be limited solely by the scope of the claims appended hereto.

What is claimed is:

1. A superconductor comprising: high-Tc BSCCO family superconducting material, and carbon nanotubes embedded in the high-Tc superconducting material.

2. A method of preparing a superconductor sample comprising the steps of:

providing a high-Tc BSCCO family superconducting powder, providing a carbon nanotube powder, mixing said superconducting powder and said carbon nanotube powder and a solvent to form a wet mixture and evaporating said solvent to form a mixed powder; and treating said mixed powder to form a bulk sample with restored optimal superconducting properties.

3. A method of preparing a superconductor sample as set forth in claim 2, further comprising preheating the sample in an atmosphere exhibiting an absence of an oxidizing agent to a first temperature at which wetting of the carbon nanotubes occurs without significant burn off of the carbon nanotubes, and then heating the sample in an oxygen containing atmosphere to a second temperature sufficient to restore the optimal superconducting properties.

4. A method of preparing a superconductor sample as set forth in claim 3, where said atmosphere exhibiting the absence of an oxidizing agent is argon.

5. A superconductor as set forth in claim 1, where said high-Tc superconducting material is $Bi_2Sr_2CaCu_2O_{8+x}$.

6. A superconductor as set forth in claim 1, where said carbon nanotubes comprise an initial weight of up to approximately 14 percent by weight of the superconducting material.

7. A superconductor as set forth in claim 6, where said carbon nanotubes comprise an initial weight of approximately 5 to 8 percent by weight of the superconducting material.

8. A superconductor as set forth in claim 5, where said carbon nanotubes comprise an initial weight of up to approximately 14 percent by weight of the superconducting material.

9. A superconductor as set forth in claim 8, where said carbon nanotubes comprise an initial weight of approximately 5 to 8 percent by weight of the superconducting material.

10. A method of preparing a superconductor sample comprising the steps of:

providing a high-Tc BSCCO family superconducting powder, providing a carbon nanotube powder;

mixing said superconducting powder and said carbon nanotube powder to form a mixed powder; and treating said mixed powder to form a bulk sample with restored optimal superconducting properties.

11. A method of preparing a superconductor sample as set forth in claim 10, where said mixing further comprises the steps of:

dispersing said superconducting powder and said carbon nanotube powder in a solvent to form a dispersion, sonicating said dispersion;

evaporating said solvent to form a mixed powder; and compressing the mixed powder to form the superconductor sample.

12. A method of preparing a superconductor sample as set forth in claim 10, further comprising preheating the sample in an atmosphere exhibiting an absence of an oxidizing agent to a first temperature at which wetting of the carbon nanotubes occurs without significant burn off of the carbon nanotubes, and then heating the sample in an oxygen containing atmosphere to a second temperature sufficient to restore the optimal superconducting properties.

13. A method of preparing a superconductor sample as set forth in claim 10, further comprising preheating the sample in an atmosphere exhibiting an absence of an oxidizing agent to a temperature at which wetting of the carbon nanotubes occurs without significant burn off of the carbon nanotubes, and then heating the sample in an oxygen containing atmosphere at said temperature until said carbon nanotubes are partially or fully consumed thereby forming voids or other extended defects in said sample.

14. A method of preparing a superconductor sample as set forth in claim 4, where said superconducting powder is $Bi_2Sr_2CaCu_2O_{8+x}$.

15. A method of preparing a superconductor sample as set forth in claim 10, where said superconducting powder is $Bi_2Sr_2CaCu_2O_{8+x}$.

16. A method of preparing a superconductor sample as set forth in claim 11, where said solvent is ethanol.

17. A method of preparing a superconductor sample as set forth in claim 12, where said atmosphere exhibiting the absence of an oxidizing agent is argon.

18. A method of preparing a superconductor sample as set forth in claim 17, where said superconducting powder is $Bi_2Sr_2CaCu_2O_{8+x}$.

19. A method of preparing a superconductor sample as set forth in claim 18, where said first temperature is approximately 760° C.

20. A method of preparing a superconductor sample as set forth in claim 19, where said temperature is approximately 806° C.

21. A superconductor fabricated in accordance with the method as set forth in claim 10.

22. A superconductor fabricated in accordance with the method as set forth in claim 12.

23. A superconductor fabricated in accordance with the method as set forth in claim 13.

24. method of preparing a superconductor sample as set forth in claim 14, where said first temperature is approximately 760° C.

25. A superconductor fabricated in accordance with the method as set forth in claim 15.

26. A superconductor fabricated in accordance with the method as set forth in claim 20.

27. A method of preparing a superconductor sample comprising the steps of:

dispersing $Bi_2Sr_2CaCu_2O_{8+x}$ powder and carbon nanotubes in ethanol to form a dispersion, sonicating the dispersion, evaporating said ethanol, compressing the powder by applying uniaxial pressure of approximately 1 kbar to form a sample, preheating the sample in argon to a temperature of less than approximately 806° C.; and heating the sample in an atmosphere containing oxygen at a temperature of approximately 806° C.

28. A method of preparing a superconductor sample as set forth in claim 11, further comprising preheating the sample in an atmosphere exhibiting an absence of an oxidizing agent to a first temperature at which wetting of the carbon nanotubes occurs without significant burn off of the carbon nanotubes, and then heating the sample in an oxygen containing atmosphere to a second temperature sufficient to restore the optimal superconducting properties.

29. A method of preparing a superconductor sample as set forth in claim 11, further comprising preheating the sample in an atmosphere exhibiting an absence of an oxidizing agent to a temperature at which wetting of the carbon nanotubes occurs without significant burn off of the carbon nanotubes, and then heating the sample in an oxygen containing atmosphere at said temperature until said carbon nanotubes are partially or fully consumed thereby forming voids or other extended defects in said sample.

30. A method of preparing a superconductor sample as set forth in claim 24, where said second temperature is approximately 806° C.

31. A superconductor fabricated in accordance with the method as set forth in claim 2.

32. A method of preparing a superconductor sample as set forth in claim 2, further comprising preheating the sample in an atmosphere exhibiting an absence of an oxidizing agent to a temperature at which wetting of the carbon nanotubes occurs without significant burn off of the carbon nanotubes, and then heating the sample in an oxygen containing atmosphere at said temperature until said carbon nanotubes are partially or fully consumed thereby forming voids or other extended defects in said sample.

33. A method of preparing a superconductor sample as set forth in claim 2, where said superconducting powder is $Bi_2Sr_2CaCu_2O_{8+x}$.

34. A method of preparing a superconductor sample as set forth in claim 3, where said solvent is ethanol.

35. A superconductor fabricated in accordance with the method as set forth in claim 3.

36. A superconductor fabricated in accordance with the method as set forth in claim 32.

37. A superconductor fabricated in accordance with the method as set forth in claim 33.

* * * * *